(12) United States Patent
Nakanishi

(10) Patent No.: US 11,060,907 B2
(45) Date of Patent: Jul. 13, 2021

(54) OPTICAL MODULE HAVING STRUCTURE TO REDUCE STRAY LIGHT

(71) Applicant: SUMITOMO ELECTRIC INDUSTRIES, LTD., Osaka (JP)

(72) Inventor: Hiromi Nakanishi, Hyogo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 144 days.

(21) Appl. No.: 16/477,695

(22) PCT Filed: Nov. 15, 2017

(86) PCT No.: PCT/JP2017/041156
§ 371 (c)(1),
(2) Date: Jul. 12, 2019

(87) PCT Pub. No.: WO2018/163513
PCT Pub. Date: Sep. 13, 2018

(65) Prior Publication Data
US 2019/0360862 A1 Nov. 28, 2019

(30) Foreign Application Priority Data
Mar. 6, 2017 (JP) .............................. JP2017-042145

(51) Int. Cl.
*G01J 1/44* (2006.01)
*G01J 1/08* (2006.01)
(Continued)

(52) U.S. Cl.
CPC ............... *G01J 1/44* (2013.01); *G01J 1/0209* (2013.01); *G01J 1/0411* (2013.01); *G01J 1/08* (2013.01)

(58) Field of Classification Search
CPC .......... G01J 1/44; G01J 1/0209; G01J 1/0411; G01J 1/08; G01J 1/32; G01J 1/0204;
(Continued)

(56) References Cited

U.S. PATENT DOCUMENTS 6,931,215 B1* 8/2005 Fukuda ................ G02B 6/4208
372/34
7,106,980 B2* 9/2006 Nakanishi .......... G02B 6/12007
257/E31.117
(Continued)

FOREIGN PATENT DOCUMENTS

JP H03-105985 5/1991
JP H08-018152 1/1996
(Continued)

*Primary Examiner* — Seung C Sohn
(74) *Attorney, Agent, or Firm* — IPUSA, PLLC

(57) ABSTRACT

An optical module includes a base member, a red semiconductor laser, a green semiconductor laser, a blue semiconductor laser, a first light receiving device having a first light receiving face that receives backward red light emitted from the red semiconductor laser, a second light receiving device having a second light receiving face that receives backward green light emitted from the green semiconductor laser, a third light receiving device having a third light receiving face that receives backward blue light emitted from the blue semiconductor laser, wherein the first light receiving face, the second light receiving face, and the third light receiving face are inclined relative to planes perpendicular to optical axes of the backward red light, the backward green light, and the backward blue light, respectively, to reduce the likelihood of occurrence of stray light.

9 Claims, 11 Drawing Sheets

(51) Int. Cl.
*G01J 1/02* (2006.01)
*G01J 1/04* (2006.01)

(58) Field of Classification Search
CPC ............... G01J 1/0403; G01J 1/4228; G01J 2001/4247; H01S 5/4012; H01S 5/4093; H01S 5/4025; H01S 5/0683; H01S 5/02208
See application file for complete search history.

(56) References Cited

U.S. PATENT DOCUMENTS

| | | | |
|---|---|---|---|
| 7,183,581 B2 * | 2/2007 | Nagai | H01S 5/02326 257/82 |
| 2003/0102496 A1 | 6/2003 | Kuhara et al. | |
| 2003/0122061 A1 * | 7/2003 | Kawano | H01S 5/02326 250/214 R |
| 2003/0128727 A1 * | 7/2003 | Torazawa | H01S 5/02325 372/36 |
| 2017/0063037 A1 | 3/2017 | Luo et al. | |

FOREIGN PATENT DOCUMENTS

| | | |
|---|---|---|
| JP | 2003-198032 | 7/2003 |
| JP | 2006-186243 | 7/2006 |
| JP | 2009-267251 | 11/2009 |
| WO | 2002/063730 | 8/2002 |

* cited by examiner

OPTICAL MODULE HAVING STRUCTURE TO REDUCE STRAY LIGHT

TECHNICAL FIELD

The disclosures herein relate to an optical module.

The present application claims priority to Japanese application No. 2017-042145 filed on Mar. 6, 2017, the entire contents of which are hereby incorporated by reference.

BACKGROUND ART

An optical module that has a semiconductor laser as a light source may have a light receiving device that receives part of the light emitted from the semiconductor laser. The light receiving device may have a structure in which a semiconductor layer is disposed on a substrate, and a light receiving face is disposed on the main surface on the same side as the semiconductor layer, for example (see, e.g., Patent Document 1).

RELATED-ART DOCUMENTS

Patent Document

[Patent Document 1] Japanese Patent Application Publication No. 2009-267251

SUMMARY OF THE INVENTION

Means to Solve the Problem

An optical module according to an embodiment includes a light forming unit configured to form light and a protective member disposed to cover the light forming unit. The light forming unit includes a base member, a red semiconductor laser disposed on the base member to emit red light, a green semiconductor laser disposed on the base member to emit green light, and a blue semiconductor laser disposed on the base member to emit blue light. The light forming unit further includes a first lens disposed on the base member to change a spot size of light emitted from the red semiconductor laser, a second lens disposed on the base member to change a spot size of light emitted from the green semiconductor laser, and a third lens disposed on the base member to change a spot size of light emitted from the blue semiconductor laser. The light forming unit further includes a first light receiving device disposed on the base member and having a first light receiving face that receives backward red light emitted from the red semiconductor laser in an opposite direction to light emitted therefrom toward the first lens, a second light receiving device disposed on the base member and having a second light receiving face that receives backward green light emitted from the green semiconductor laser in an opposite direction to light emitted therefrom toward the second lens, and a third light receiving device disposed on the base member and having a third light receiving face that receives backward blue light emitted from the blue semiconductor laser in an opposite direction to light emitted therefrom toward the third lens. The first light receiving face, the second light receiving face, and the third light receiving face are inclined relative to a plane perpendicular to an optical axis of the backward red light, a plane perpendicular to an optical axis of the backward green light, and a plane perpendicular to an optical axis of the backward blue light, respectively.

MODE FOR CARRYING OUT THE INVENTION

Figure 1:
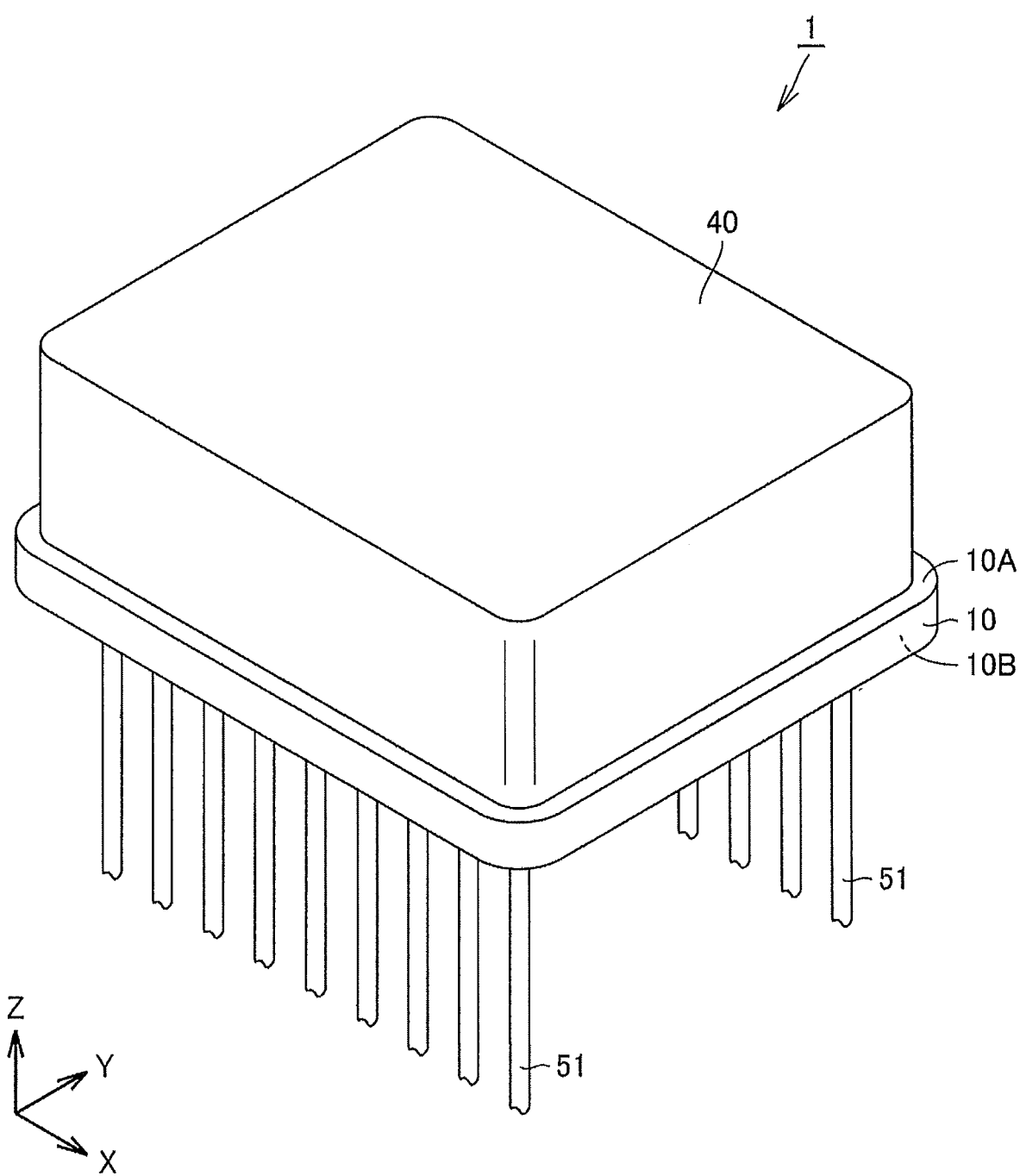
FIG. 1 is a schematic axonometric view illustrating the structure of an optical module of a first embodiment.

Problem to be Solved by the Present Disclosure

In the optical module that has a light receiving device, part of the light from a semiconductor laser incident on the light receiving face may be reflected at the light receiving face to exit from the light module, resulting in the occurrence of an incident (i.e., stray light) in which light reaches an unintended location. Depending on the device in which the optical module is used as a component, stray light may be undesirable when considering the function of the device.

Accordingly, one of the objects of the present disclosures is to provide an optical module in which stray light is unlikely to occur.

Advantage of the Present Disclosure

According to the optical module of at least one embodiment of the present disclosures, stray light may be unlikely to occur.

Description of Embodiments of the Present Disclosure

Embodiments of the technologies of the present disclosures will be listed and described first. The optical module of the present disclosures includes a light forming unit for forming light and a protective member arranged to cover the light forming unit. The light forming unit includes a base member, a red semiconductor laser disposed on the base member to emit red light, a green semiconductor laser disposed on the base member to emit green light, and a blue semiconductor laser disposed on the base member to emit blue light. The light forming unit further includes a first lens disposed on the base member to change a spot size of light emitted from the red semiconductor laser, a second lens disposed on the base member to change a spot size of light emitted from the green semiconductor laser, and a third lens disposed on the base member to change a spot size of light emitted from the blue semiconductor laser. The light forming unit further includes a first light receiving device disposed on the base member and having a first light receiving face that receives backward red light emitted from the red semiconductor laser in an opposite direction to light emitted therefrom toward the first lens, a second light receiving device disposed on the base member and having a second light receiving face that receives backward green light emitted from the green semiconductor laser in an opposite direction to light emitted therefrom toward the second lens, and a third light receiving device disposed on the base member and having a third light receiving face that receives backward blue light emitted from the blue semiconductor laser in an opposite direction to light emitted therefrom toward the third lens. The first light receiving face, the second light receiving face, and the third light receiving face are inclined relative to a plane perpendicular to an optical axis of the backward red light, a plane perpendicular to an optical axis of the backward green light, and a plane perpendicular to an optical axis of the backward blue light, respectively.

The optical module of the present embodiment includes the red, green, and blue semiconductor lasers and the light receiving devices receiving backward light from those semiconductor lasers. If the light receiving face of a light receiving device were perpendicular to the optical axis of backward light, the light receiving face would be able to receive the backward light efficiently. According to study performed by the inventor of the present invention, such a configuration would possibly cause the occurrence of stray light. Specifically, part of the backward light incident on the light receiving face is reflected at the light receiving face. The backward light is emitted from a semiconductor laser in an opposite direction to light (forward light) emitted from the semiconductor laser toward a lens along the same straight line. If the light receiving face of the light receiving device were disposed to be perpendicular to the optical axis of backward light, the backward light reflected at the light receiving face would travel on the (substantially) same light path as the forward light to enter the lens, followed by exiting from the optical module. As a result, the backward light reflected at the light receiving face would become stray light.

According to the optical module of the present disclosures, the first light receiving face, the second light receiving face, and the third light receiving face are inclined relative to a plane perpendicular to an optical axis of the backward red light, a plane perpendicular to an optical axis of the backward green light, and a plane perpendicular to an optical axis of the backward blue light, respectively. This arrangement makes it unlikely for the backward light reflected at a light receiving face to travel on the (substantially) same light path as the forward light to enter a lens. As a result, the likelihood of occurrence of stray light is reduced. As described above, the optical module of the present disclosures reduces the likelihood of occurrence of stray light.

In the optical module described above, the first light receiving face, the second light receiving face, and the third light receiving face may be inclined relative to a plane perpendicular to an optical axis of the backward red light, a plane perpendicular to an optical axis of the backward green light, and a plane perpendicular to an optical axis of the backward blue light, respectively, through a rotation in a direction within a first plane inclusive of an optical axis of received light and perpendicular to a main surface of the base member together with a rotation in a direction within a second plane parallel to the main surface of the base member, relative to a plane perpendicular to an optical axis of the backward red light, a plane perpendicular to an optical axis of the backward green light, and a plane perpendicular to an optical axis of the backward blue light, respectively. This arrangement further reduces the likelihood of the occurrence of stray light.

In the optical module described above, at least one light receiving device among the first light receiving device, the second light receiving device, and the third light receiving device may be mounted on a mounting surface of a support disposed on the base member. The mounting surface may be inclined relative to a plane perpendicular to an optical axis of light received by the at least one light receiving device. Use of the configuration in which the mounting surface of the support is inclined relative to the plane perpendicular to the optical axis of light (backward light) makes it easier to tilt the light receiving face relative to the plane perpendicular to the optical axis of the backward light.

In the above-described optical module, at least one light receiving device among the first light receiving device, the second light receiving device, and the third light receiving device may be a light receiving semiconductor device including a semiconductor layer, and The light receiving semiconductor device may have a light receiving face inclined relative to a plane parallel to a main surface of the semiconductor layer. Use of such a light receiving semiconductor device makes it easier to tilt the light receiving face relative to the plane perpendicular to the optical axis of backward light.

An optical module according to another aspect of the present disclosures includes a base member, a semiconductor laser disposed on the base member, an optical system disposed on the base member to receive light from the semiconductor laser, and a light receiving device disposed on the base member and having a light receiving face that receives backward light emitted from the semiconductor laser in an opposite direction to light emitted from the semiconductor laser toward the optical system, wherein the light receiving face is inclined relative to a plane perpendicular to an optical axis of the backward light.

In the optical module of the present disclosures, the light receiving face is inclined relative to the plane perpendicular to the optical axis of backward light. This arrangement makes it unlikely for the backward light reflected at a light receiving face to travel on the (substantially) same light path as the forward light to enter the optical system. As a result, the likelihood of occurrence of stray light is reduced. As described above, the optical module of the present disclosures reduces the likelihood of occurrence of stray light.

Details of Embodiments of the Present Disclosure

First Embodiment

Figure 2:
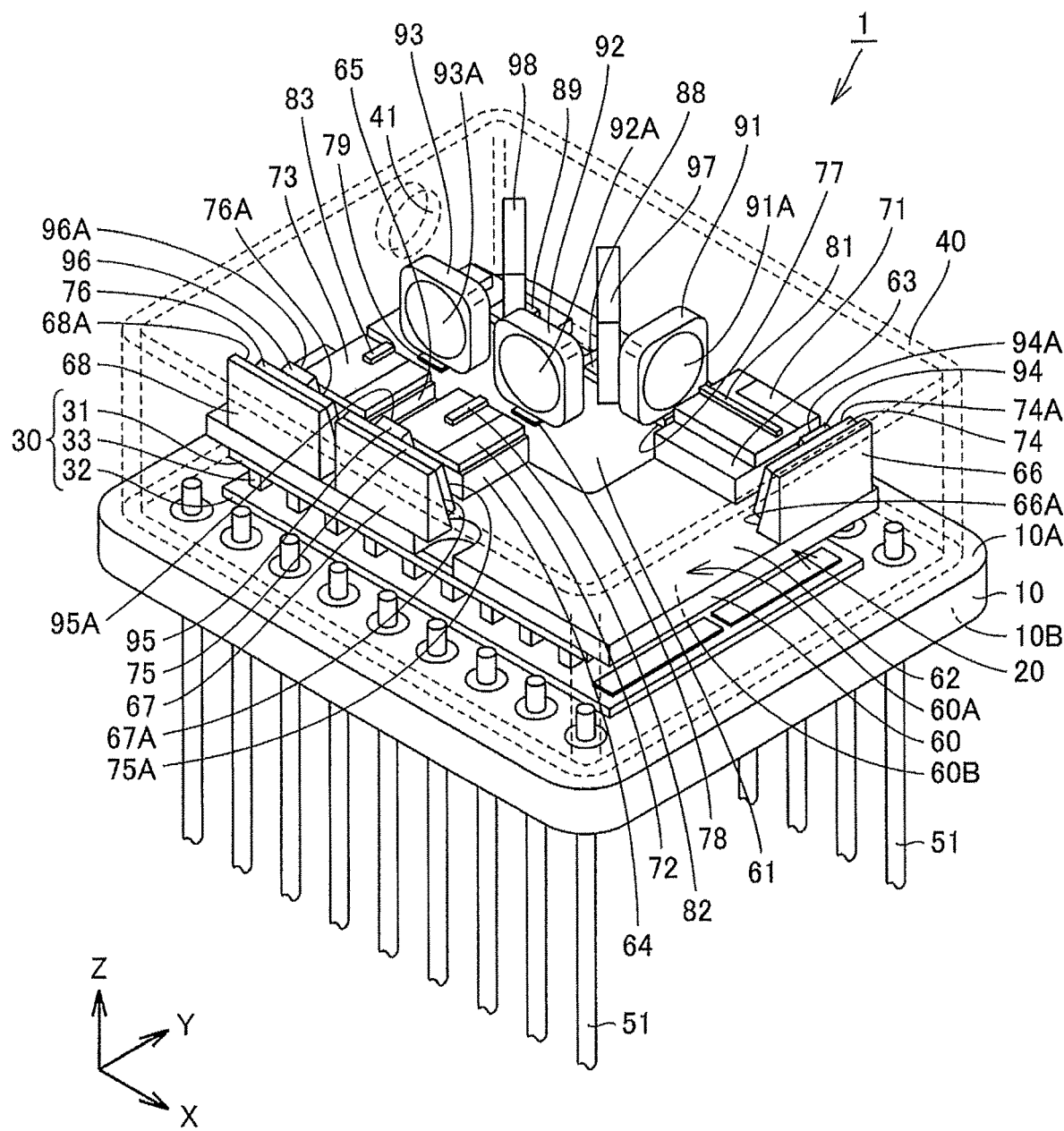
FIG. 2 is a schematic axonometric view illustrating the structure of the optical module of the first embodiment.

In the following, a first embodiment of the optical module of the present disclosures will be described by referring to FIG. 1 through FIG. 3. FIG. 2 is a drawing illustrating what is observed when the cap 40 of FIG. 1 is removed. In the following drawings, the same or corresponding elements are referred to by the same numerals, and a duplicate description thereof will be omitted.

Referring to FIG. 1 and FIG. 2, the optical module 1 in the present embodiment includes a base 10 having a flat plate shape, a light forming unit 20 disposed on a first main surface 10A of the base 10 to form light, a cap 40 disposed in contact with the first main surface 10A of the base 10 to cover the light forming unit 20, and a plurality of lead pins 51 penetrating through the base 10 from a second main surface 10B to the first main surface 10A and protruding from both the first main surface 10A and the second main surface 10B. The base 10 and cap 40 are welded, for example, to provide a hermetic seal. Namely, the light forming unit 20 is hermetically sealed by the base 10 and the cap 40. The space encapsulated by the base 10 and the cap 40 is filled with a gas such as dry air for which moisture content is reduced (removed). The cap 40 has an exit window 41 allowing the passage of light coming from the light forming unit 20. The exit window 41 may have a planar shape with the main planes thereof parallel to each other, or may have a lens shape to collect or spread light from the light forming unit 20. The base 10 and cap 40 constitute a protective member.

Figure 3:
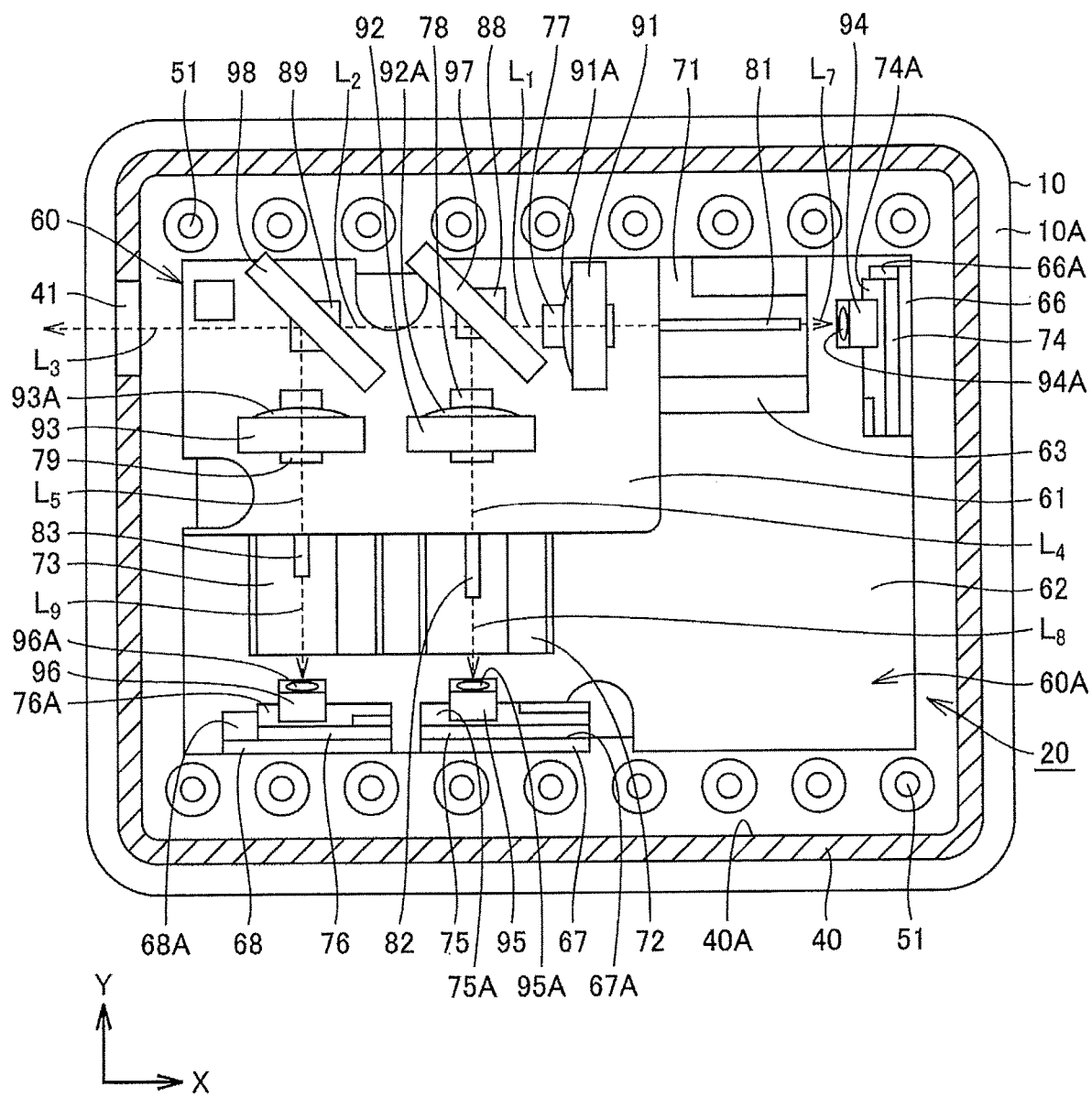
FIG. 3 is a schematic plan view illustrating the structure of the optical module of the first embodiment.

Referring to FIG. 2 and FIG. 3, the light forming unit 20 includes a base plate 60 which is a base member having a plate shape. The base plate 60 has a first main surface 60A having a rectangular shape in a plan view. A first block 63, a second block 64, and a third block 65 each having a rectangular parallelpiped shape are disposed on the main surface 60A. A first submount 71, a second submount 72, and a third submount 73 each having a plate shape are disposed on the first block 63, the second block 64, and the third block 65, respectively. A red laser diode 81 serving as a red semiconductor laser, a green laser diode 82 serving as a green semiconductor laser, and a blue laser diode 83 serving as a blue semiconductor laser are disposed on the first submount 71, the second submount 72, and the third submount 73, respectively.

The red laser diode 81 is arranged to emit light in a direction (i.e., the X-axis direction) parallel to the long side of the main surface 60A having a rectangular shape. The green laser diode 82 and the blue laser diode 83 are arranged to emit light in a direction (i.e., Y-axis direction) parallel to the short side of the main surface 60A. The heights of the optical axes of the red laser diode 81, the green laser diode 82, and the blue laser diode 83 (i.e., the distance between a reference plane and an optical axis when the first main surface 60A of the base plate 60 serves as the reference plane; the distance from the reference plane in the Z-axis direction) are adjusted to be equal to each other by the first block 63, the second block 64, and the third block 65 as well as the first submount 71, the second submount 72, and the third submount 73.

A first lens support 77, a second lens support 78, and a third lens support 79 each having a pedestal shape are formed on the main surface 60A of the base plate 60. The first lens support 77, the second lens support 78, and the third lens support 79 have a first lens 91, a second lens 92, and a third lens 93, respectively, disposed thereon. The first lens 91, the second lens 92, and the third lens 93 each have lens sections 91A, 92A, and 93A, respectively, the surfaces of which are formed as lens surfaces. The first lens 91, the second lens 92, and the third lens 93 are such that the lens sections 91A, 92A, and 93A and the remaining portions other than the lens sections 91A, 92A, and 93A are integrally molded. The central axes of the lens sections 91A, 92A, and 93A of the first lens 91, the second lens 92, and the third lens 93, i.e., the optical axes of the lens sections 91A, 92A, and 93A, are adjusted by the first lens support 77, the second lens support 78, and the third lens support 79, respectively, to coincide with the optical axes of the red laser diode 81, the green laser diode 82, and the blue laser diode 83, respectively.

The first lens 91 receives light (forward red light) emitted from the red laser diode 81. The second lens 92 receives light (forward green light) emitted from the green laser diode 82. The third lens 93 receives light (forward blue light) emitted from the blue laser diode 83. The first lens 91, the second lens 92, and the third lens 93 change the spot sizes of light emitted from the red laser diode 81, the green laser diode 82, and the blue laser diode 83, respectively. The first lens 91, the second lens 92 and the third lens 93 change the spot sizes such that the spot sizes of light emitted from the red laser diode 81, the green laser diode 82 and the blue laser diode 83 coincide with each other.

A first filter 97 and a second filter 98 are disposed on the main surface 60A of the base plate 60. Each of the first filter 97 and the second filter 98 has a plate shape having main surfaces thereof parallel to each other. The first filter 97 and the second filter 98 are wavelength selective filters, for example. The first filter 97 and the second filter 98 are dielectric multilayer-film filters. More specifically, the first filter 97 transmits red light and reflects green light. The second filter 98 transmits red and green light and reflects blue light. In this manner, the first filter 97 and the second filter 98 selectively transmit and reflect light of particular wavelengths. With this arrangement, the first filter 97 and the second filter 98 combine light emitted from the red laser diode 81, the green laser diode 82, and the blue laser diode 83. The first filter 97 and the second filter 98 are disposed on a first protrusion 88 and a second protrusion 89, respectively, each having a pedestal shape and formed on the main surface 60A.

A fourth block 66, a fifth block 67, and a sixth block 68, each having a right quadrilateral prism shape with a pair of trapezoidal bases, are disposed on the main surface 60A of the base plate 60. The fourth block 66, the fifth block 67, and the sixth block 68 are disposed on the main surface 60A such that the lateral face having the longer one of the parallel sides of the trapezoidal bases contacts the main surface 60A. The fourth block 66, the fifth block 67, and the sixth block 68 are disposed on the main surface 60A such that the lateral face having sides perpendicular to the parallel sides of the trapezoidal bases are perpendicular to the optical axis of light emitted from the red laser diode 81, the green laser diode 82 and the blue laser diode 83, respectively. As a result, support surfaces 66A, 67A, and 68A, each of which is a lateral face including a side that connects the parallel sides of the trapezoidal bases and that is not perpendicular to the parallel side, are inclined relative to the planes perpendicular to the optical axes of light emitted from the red laser diode 81, the green laser diode 82, and the blue laser diode 83, respectively.

More specifically, the support surface 66A of the fourth block 66 is inclined relative to the plane perpendicular to the optical axis of light emitted from the red laser diode 81 through a rotation by an angle of greater than 0 degrees and less than 90 degrees in the direction of rotation within the X-Z plane. More preferably, the support surface 66A of the fourth block 66 is inclined relative to the plane perpendicular to the optical axis of light emitted from the red laser diode 81 through a rotation by an angle of greater than 10 degrees and less than 30 degrees in the direction of rotation within the X-Z plane. The support surface 67A of the fifth block 67 and the support surface 68A of the sixth block 68 are inclined relative to the planes perpendicular to the optical axes of light emitted from the green laser diode 82 and the blue laser diode 83, respectively, through a rotation by an angle of greater than 0 degrees and less than 90 degrees in the direction of rotation within the Y-Z plane. More preferably, the support surface 67A of the fifth block 67 and the support surface 68A of the sixth block 68 are inclined relative to the planes perpendicular to the optical axes of light emitted from the green laser diode 82 and the blue laser diode 83, respectively, through a rotation by an angle of greater than 10 degrees and less than 30 degrees in the direction of rotation within the Y-Z plane.

A fourth submount 74, a fifth submount 75, and a sixth submount 76 each having a flat plate shape are disposed on the support surfaces 66A, 67A, and 68A of the fourth block 66, the fifth block 67, and the sixth block 68, respectively. As a result, mounting surfaces 74A, 75A, 76A, which are the main surfaces of the fourth submount 74, the fifth submount 75, and the sixth submount 76 situated opposite to the fourth block 66, the fifth block 67, and the sixth block 68, respectively, are inclined relative to the planes perpendicular to the optical axes of light emitted from the red laser diode 81, the green laser diode 82, and the blue laser diode 83, respectively.

A first photodiode 94 serving as a first light receiving device, a second photodiode 95 serving as a second light receiving device, and a third photodiode 96 serving as a third light receiving device are disposed on the fourth submount 74, the fifth submount 75, and the sixth submount 76, respectively. The fourth block 66 and the fourth submount 74 constitute a support member for the first photodiode 94. The fifth block 67 and the fifth submount 75 constitute a support member for the second photodiode 95. The sixth block 68 and the sixth submount 76 constitute a support member for the third photodiode 96.

The first photodiode 94 receives, at a first light receiving face 94A, backward red light emitted from the red laser diode 81 in the opposite direction to the forward red light traveling from the red laser diode 81 to the first lens 91. The second photodiode 95 receives, at a second light receiving face 95A, backward green light emitted from the green laser diode 82 in the opposite direction to the forward green light traveling from the green laser diode 82 to the second lens 92. The third photodiode 96 receives, at a third light receiving face 96A, backward blue light emitted from the blue laser diode 83 in the opposite direction to the forward blue light traveling from the blue laser diode 83 to the third lens 93.

In the following, the first photodiode 94 will be described as an example of the structure of a light receiving device used in the present embodiment. The second photodiode 95 and the third photodiode 96 have the same or similar structure as the first photodiode 94.

Figure 4:
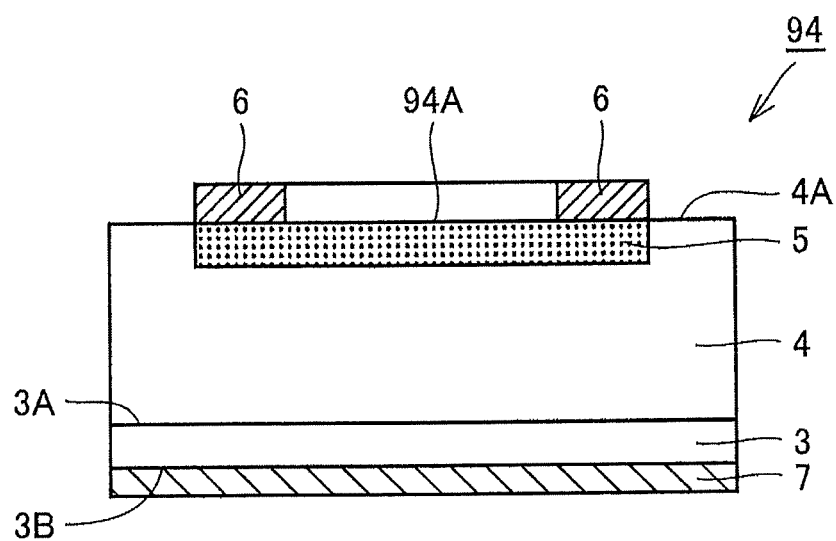
FIG. 4 is a schematic cross-sectional view illustrating the structure of a light receiving device of the first embodiment.

Referring to FIG. 4, the first photodiode 94 includes a high-concentration n-type layer 3, an n-type layer 4, a p-type region 5, a p-side electrode 6, and an n-side electrode 7.

The high-concentration n-type layer 3 contains an n-type impurity to have an n-type conductivity type. The n-type layer 4 is disposed on and in contact with a first main surface 3A of the high-concentration n-type layer. The n-type layer 4 contains an n-type impurity at a lower concentration than the high-concentration n-type layer 3 to have an n-type conductivity type. The p-type region 5 is formed within the n-type layer 4 to include the first main surface 4A of the n-type layer 4. The p-type region 5 contains a p-type impurity to have a p-type conductivity type. The high-concentration n-type layer 3, the n-type layer 4, and the p-type region 5 constitute a semiconductor layer.

The n-side electrode 7 is disposed on and in contact with a second main surface 3B of the high-concentration n-type layer 3. The n-side electrode 7 is made of a conductor such as metal. The n-side electrode 7 is in ohmic contact with the high-concentration n-type layer 3. The p-side electrode 6 is disposed on and in contact with the main surface of the semiconductor layer situated opposite to the n-side electrode 7. The p-side electrode 6 is disposed on and in contact with the p-type region 5 exposed at the main surface of the semiconductor layer. The p-side electrode 6 is made of a conductor such as metal. The p-side electrode 6 is in ohmic contact with the p-type region 5. The light receiving face 94A for receiving light incident on the semiconductor layer is formed on the main surface of the semiconductor layer situated opposite to the n-side electrode 7. The p-side electrode 6 has a closed-loop (annular) shape surrounding the outer periphery of the first light receiving face 94A.

Light entering the light receiving face 94A causes carriers to be generated in numbers corresponding to the intensity of light incident in the p-type region 5 and the n-type layer 4. Detecting this as a current through the p-side electrode 6 and the n-side electrode 7 allows information about the intensity of incident light to be obtained.

Referring to FIG. 2 through FIG. 4, the first photodiode 94 is disposed on the fourth submount 74 such that the main surface of the n-side electrode 7 situated opposite to the high-concentration n-type layer 3 faces the mounting surface 74A. The second photodiode 95 is disposed on the fifth submount 75 such that the main surface of the n-side electrode 7 situated opposite to the high-concentration n-type layer 3 faces the mounting surface 75A. The third photodiode 96 is disposed on the sixth submount 76 such that the main surface of the n-side electrode 7 situated opposite to the high-concentration n-type layer 3 faces the mounting surface 76A. As a result, the first light receiving face 94A, the second light receiving face 95A, and the third light receiving face 96A are inclined with respect to a plane perpendicular to the optical axis of the backward red light, a plane perpendicular to the optical axis of the backward green light, and a plane perpendicular to the optical axis of the backward blue light, respectively.

More specifically, the first light receiving face 94A is inclined relative to the plane perpendicular to the optical axis of light emitted from the red laser diode 81 through a rotation by an angle of greater than 0 degrees and less than 90 degrees in the direction of rotation within the X-Z plane. More preferably, the first light receiving face 94A is inclined relative to the plane perpendicular to the optical axis of light emitted from the red laser diode 81 through a rotation by an angle of greater than 10 degrees and less than 30 degrees in the direction of rotation within the X-Z plane. The second light receiving face 95A and the third light receiving face 96A are inclined relative to the planes perpendicular to the optical axes of light emitted from the green laser diode 82 and the blue laser diode 83, respectively, through a rotation by an angle of greater than 0 degrees and less than 90 degrees in the direction of rotation within the Y-Z plane. More preferably, the second light receiving face 95A and the third light receiving face 96A are inclined relative to the planes perpendicular to the optical axes of light emitted from the green laser diode 82 and the blue laser diode 83, respectively, through a rotation by an angle of greater than 10 degrees and less than 30 degrees in the direction of rotation within the Y-Z plane.

Referring to FIG. 3, the first light receiving face 94A of the first photodiode 94, the red laser diode 81, the lens section 91A of the first lens 91, the first filter 97, and the second filter 98 are aligned in one line (aligned in the X-axis direction) along the direction of light emitted from the red laser diode 81. The second light receiving face 95A of the second photodiode 95, the green laser diode 82, the lens section 92A of the second lens 92, and the first filter 97 are aligned in one line (aligned in the Y-axis direction) along the direction of light emitted from the green laser diode 82. The third light receiving face 96A of the third photodiode 96, the blue laser diode 83, the lens section 93A of the third lens 93, and the second filter 98 are aligned in one line (aligned in the Y-axis direction) along the direction of light emitted from the blue laser diode 83.

Namely, the direction of emission from the red laser diode 81 intersects the direction of emission from the green laser diode 82 and the blue laser diode 83. More specifically, the direction of emission from the red laser diode 81 is perpendicular to the direction of emission from the green laser diode 82 and the blue laser diode 83. The direction of emission from the green laser diode 82 is in substantially the same directions as the direction of emission from the blue laser diode 83. More specifically, the direction of emission from the green laser diode 82 is parallel to the direction of emission from the blue laser diode 83.

The main surfaces of the first filter 97 and the second filter 98 are inclined relative to the direction of light emitted from the red laser diode 81. More specifically, the main surfaces of the first filter 97 and the second filter 98 are at an angle of 45 degrees relative to the direction of light emitted from the red laser diode 81 (i.e., the X-axis direction). The main surfaces of the first filter 97 and the second filter 98 are rotated 45 degrees, in the direction of rotation within a plane (X-Y plane) parallel to the main surface 60A, from the plane perpendicular to the optical axis of light emitted from the red laser diode 81.

Referring to FIG. 2 and FIG. 3, further, the optical module 1 includes an electronic cooling module 30 between the base 10 and the light forming unit 20. The electronic cooling module 30 includes a heatsink plate 31, a heatsink plate 32, and semiconductor pillars 33 disposed alongside one another between the heatsink plate 31 and the heatsink plate 32 with electrodes interposed therebetween. The heatsink plate 31 and the heatsink plate 32 are made of alumina, for example. The heatsink plate 31 is disposed in contact with the main surface 60B of the base plate 60. The heatsink plate 32 is disposed in contact with the main surface 10A of the base 10. In the present embodiment, the electronic cooling module 30 is a Peltier module (Peltier device). Current flowing through the electronic cooling module 30 causes the heat of the base plate 60 in contact with the heatsink plate 31 to be transferred to the base 10, thereby cooling the base plate 60.

In the following, a description will be given of the operation of the optical module 1 according to the present embodiment. Referring to FIG. 3, forward red light emitted from the red laser diode 81 travels on a light path L1. Most of the light (i.e., red laser light) from the red laser diode 81 is emitted as forward red light. Backward red light emitted from the red laser diode 81 travels on a light path L7 to enter the first light receiving face 94A of the first photodiode 94. The ratio of intensity of forward red light to backward red light may be ascertained in advance. Because of this, information on the intensity of forward red light is obtainable from the intensity of backward red light. The amount of current flowing through the red laser diode 81 is controlled to adjust the intensity of red light based on the difference between the intensity of light indicated by the above-noted information and the target intensity of light emission.

The forward red light traveling on the light path L1 enters the lens section 91A of the first lens 91, which results in the spot size of light being adjusted. Specifically, forward red light emitted from the red laser diode 81 is converted into collimated light, for example. Forward red light with the spot size converted by the first lens 91 travels on the light path L1 to enter the first filter 97. Since the first filter 97 transmits red light, the forward red light emitted from the red laser diode 81 travels further on a light path L2 to enter the second filter 98. Since the second filter 98 transmits red light, the forward red light emitted from the red laser diode 81 travels further on a light path L3 to exit from the optical module 1 through the exit window 41 of the cap 40.

Forward green light emitted from the green laser diode 82 travels on a light path L4. Most of the light (i.e., green laser light) from the green laser diode 82 is emitted as forward green light. Backward green light emitted from the green laser diode 82 travels on a light path L8 to enter the second light receiving face 95A of the second photodiode 95. The ratio of intensity of forward green light to backward green light may be ascertained in advance. Because of this, information on the intensity of forward green light is obtainable from the intensity of backward green light. The amount of current flowing through the green laser diode 82 is controlled to adjust the intensity of green light based on the difference between the intensity of light indicated by the above-noted information and the target intensity of light emission.

The forward green light traveling on the light path L4 enters the lens section 92A of the second lens 92, which results in the spot size of light being adjusted. Specifically, forward green light emitted from the green laser diode 82 is converted into collimated light, for example. Forward green light with the spot size converted by the second lens 92 travels on the light path L4 to enter the first filter 97. Since the first filter 97 reflects green light, the forward green light emitted from the green laser diode 82 merges into the light path L2. As a result, the forward green light is combined with the forward red light, and travels on the light path L2 to enter the second filter 98. Since the second filter 98 transmits green light, the forward green light emitted from the green laser diode 82 travels further on the light path L3 to exit from the optical module 1 through the exit window 41 of the cap 40.

Forward blue light emitted from the blue laser diode 83 travels on a light path L5. Most of the light (i.e., blue laser light) from the blue laser diode 83 is emitted as forward blue light. Backward blue light emitted from the blue laser diode 83 travels on a light path L9 to enter the third light receiving face 96A of the third photodiode 96. The ratio of intensity of forward blue light to backward blue light may be ascertained in advance. Because of this, information on the intensity of forward blue light is obtainable from the intensity of backward blue light. The amount of current flowing through the blue laser diode 83 is controlled to adjust the intensity of blue light based on the difference between the intensity of light indicated by the above-noted information and the target intensity of light emission.

The forward blue light traveling on the light path L5 enters the lens section 93A of the third lens 93, which results in the spot size of light being adjusted. Specifically, forward blue light emitted from the blue laser diode 83 is converted into collimated light, for example. Forward blue light with the spot size converted by the third lens 93 travels on the light path L5 to enter the second filter 98. Since the second filter 98 reflects blue light, the forward blue light emitted from the blue laser diode 83 merges into the light path L3. As a result, the forward blue light is combined with the forward red light and the forward green light, and travels along the light path L3 to exit from the optical module 1 through the exit window 41 of the cap 40.

In this manner, light formed by combining red, green, and blue light beams exits through the exit window 41 of the cap 40. Moreover, current flowing through the electronic cooling module 30 causes the heat of the base plate 60 in contact with the heatsink plate 31 to be transferred to the base 10, thereby cooling the base plate 60. As a result, the likelihood of a temperature increase in the red laser diode 81, the green laser diode 82, and the blue laser diode 83 is reduced. This arrangement enables the use of the optical module 1 even in an environment where temperature may rise, as in the case of use in an automobile. Also, maintaining the temperature of the red laser diode 81, the green laser diode 82, and the blue laser diode 83 within an appropriate range allows light having a desired color to be accurately formed.

In the optical module 1 of the present embodiment, the first light receiving face 94A, the second light receiving face 95A, and the third light receiving face 96A are inclined with respect to a plane perpendicular to the optical axis of the backward red light, a plane perpendicular to the optical axis of the backward green light, and a plane perpendicular to the optical axis of the backward blue light, respectively. Accordingly, the optical axes of backward light reflected at the first light receiving face 94A, the second light receiving face 95A, and the third light receiving face 96A are inclined relative to the optical axes of the forward red light, the forward green light, and the forward blue light, respectively. With this arrangement, the backward light reflected at the first light receiving face 94A, the second light receiving face 95A, and the third light receiving face 96A is more unlikely to enter the first lens 91, the second lens 92, and the third lens 93, respectively, through the (substantially) same light paths as the forward light. The optical module 1 is thus an optical module for which stray light is unlikely to occur.

Second Embodiment

Figure 5:
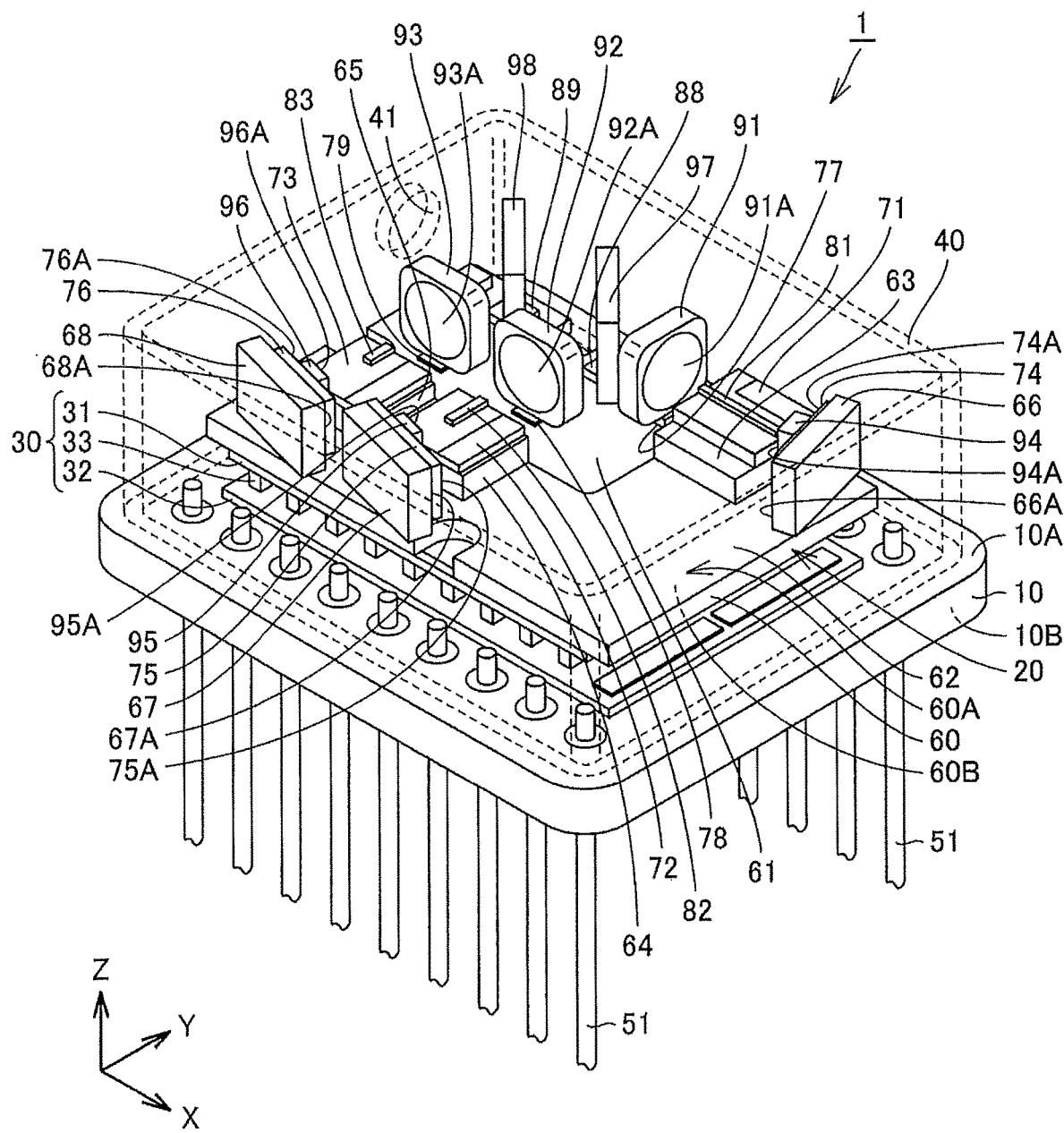
FIG. 5 is a schematic axonometric view illustrating the structure of an optical module of a second embodiment.
Figure 6:
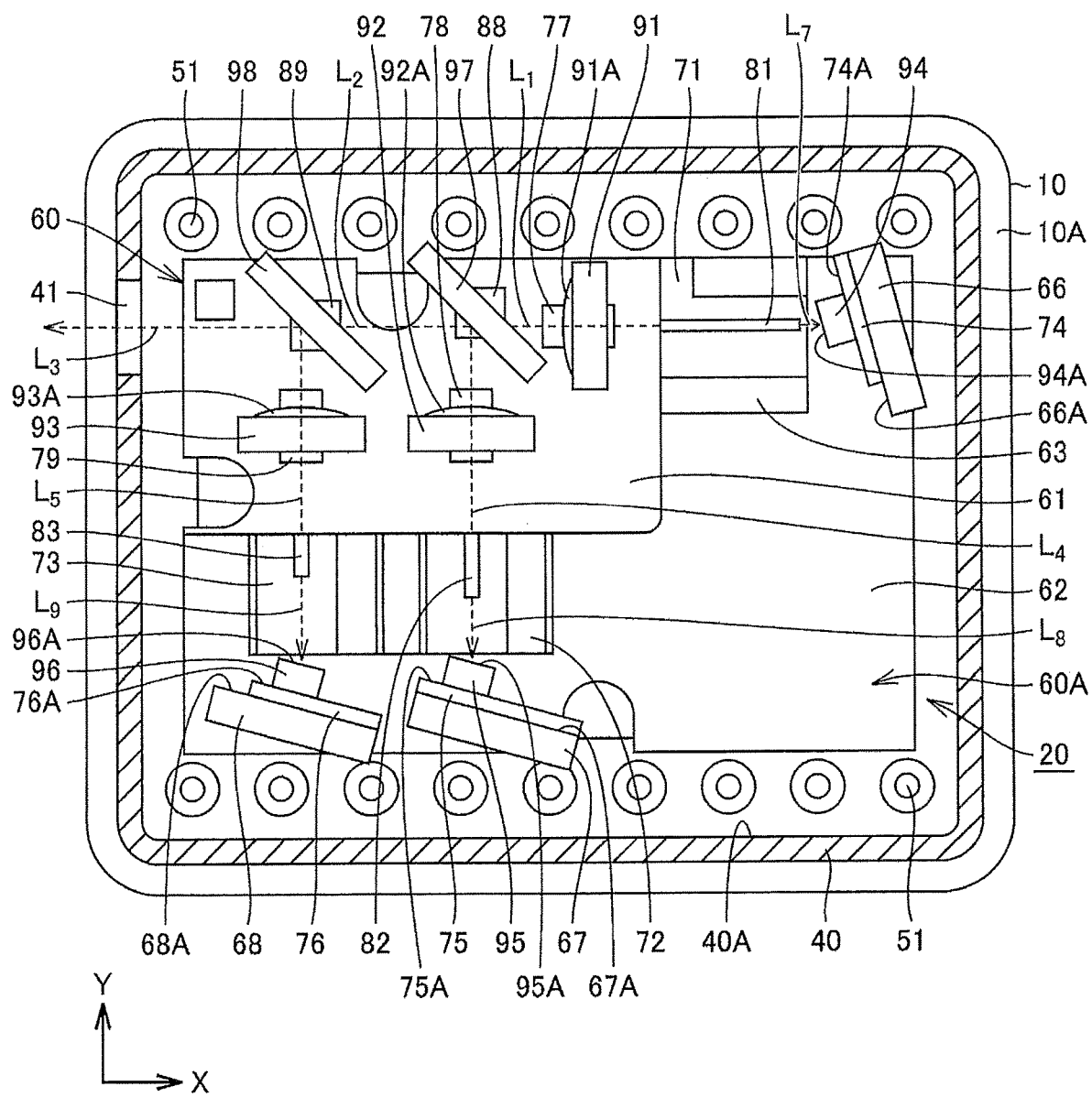
FIG. 6 is a schematic plan view illustrating the structure of the optical module of the second embodiment.

In the following, a second embodiment of the optical module of the present disclosures will be described by referring to FIG. 5 and FIG. 6. Referring to FIG. 5 and FIG. 6 as well as FIG. 1 through FIG. 4, the optical module 1 of the second embodiment essentially has a similar structure and similar advantages to the first embodiment. However, the optical module 1 of the second embodiment differs from that of the first embodiment in the arrangement of the first photodiode 94, the second photodiode 95, and the third photodiode 96.

Referring to FIG. 5 and FIG. 6, the optical module 1 of the second embodiment have the fourth block 66, the fifth block 67, and the sixth block 68 that are rectangular parallelpiped. The fourth block 66, the fifth block 67, and the sixth block 68 are disposed such that the support surfaces 66A, 67A, and 68A, which are the faces of the fourth block 66, the fifth block 67, and the sixth block 68 for supporting the fourth submount 74, the fifth submount 75, and the sixth submount 76, respectively, are inclined relative to the planes perpendicular to the optical axes of light emitted from the red laser diode 81, the green laser diode 82, and the blue laser diode 83, respectively.

More specifically, the support surfaces 66A, 67A, and 68A of the fourth block 66, the fifth block 67, and the sixth block 68 are inclined relative to the planes perpendicular to the optical axes of light emitted from the red laser diode 81, the green laser diode 82, and the blue laser diode 83, respectively, through a rotation by an angle of greater than 0 degrees and less than 90 degrees in the direction of rotation within the X-Y plane. More preferably, the support surfaces 66A, 67A, and 68A of the fourth block 66, the fifth block 67, and the sixth block 68 are inclined relative to the planes perpendicular to the optical axes of light emitted from the red laser diode 81, the green laser diode 82, and the blue laser diode 83, respectively, through a rotation by an angle of greater than 0 degrees and less than 90 degrees in the direction of rotation within the X-Y plane. As a result, the first light receiving face 94A of the first photodiode 94, the second light receiving face 95A of the second photodiode 95, and the third light receiving face 96A of the third photodiode 96 are inclined relative to the planes perpendicular to the optical axes of light emitted from the red laser diode 81, the green laser diode 82, and the blue laser diode 83, respectively, through a rotation by an angle of greater than 0 degrees and less than 90 degrees in the direction of rotation within the X-Y plane. More preferably, the first light receiving face 94A of the first photodiode 94, the second light receiving face 95A of the second photodiode 95, and the third light receiving face 96A of the third photodiode 96 are inclined relative to the planes perpendicular to the optical axes of light emitted from the red laser diode 81, the green laser diode 82, and the blue laser diode 83, respectively, through a rotation by an angle of greater than 10 degrees and less than 30 degrees in the direction of rotation within the X-Y plane.

Accordingly, the optical axes of backward light reflected at the first light receiving face 94A, the second light receiving face 95A, and the third light receiving face 96A are inclined relative to the optical axes of the forward red light, the forward green light, and the forward blue light, respectively. With this arrangement, the backward light reflected at the first light receiving face 94A, the second light receiving face 95A, and the third light receiving face 96A is more unlikely to enter the first lens 91, the second lens 92, and the third lens 93, respectively, through the (substantially) same light paths as the forward light. The optical module 1 is thus an optical module for which stray light is unlikely to occur.

Third Embodiment

Figure 7:
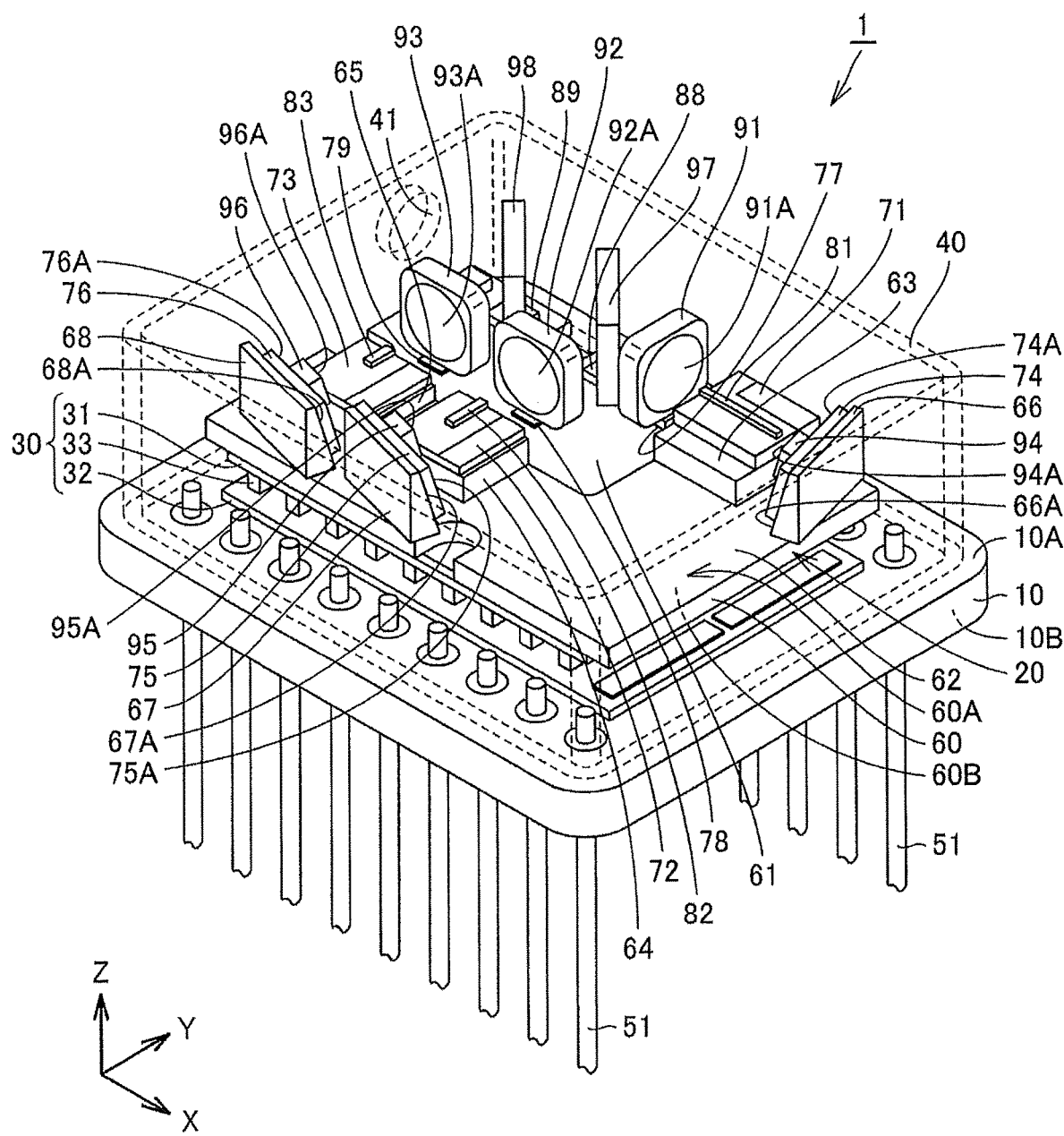
FIG. 7 is a schematic axonometric view illustrating the structure of an optical module of a third embodiment.
Figure 8:
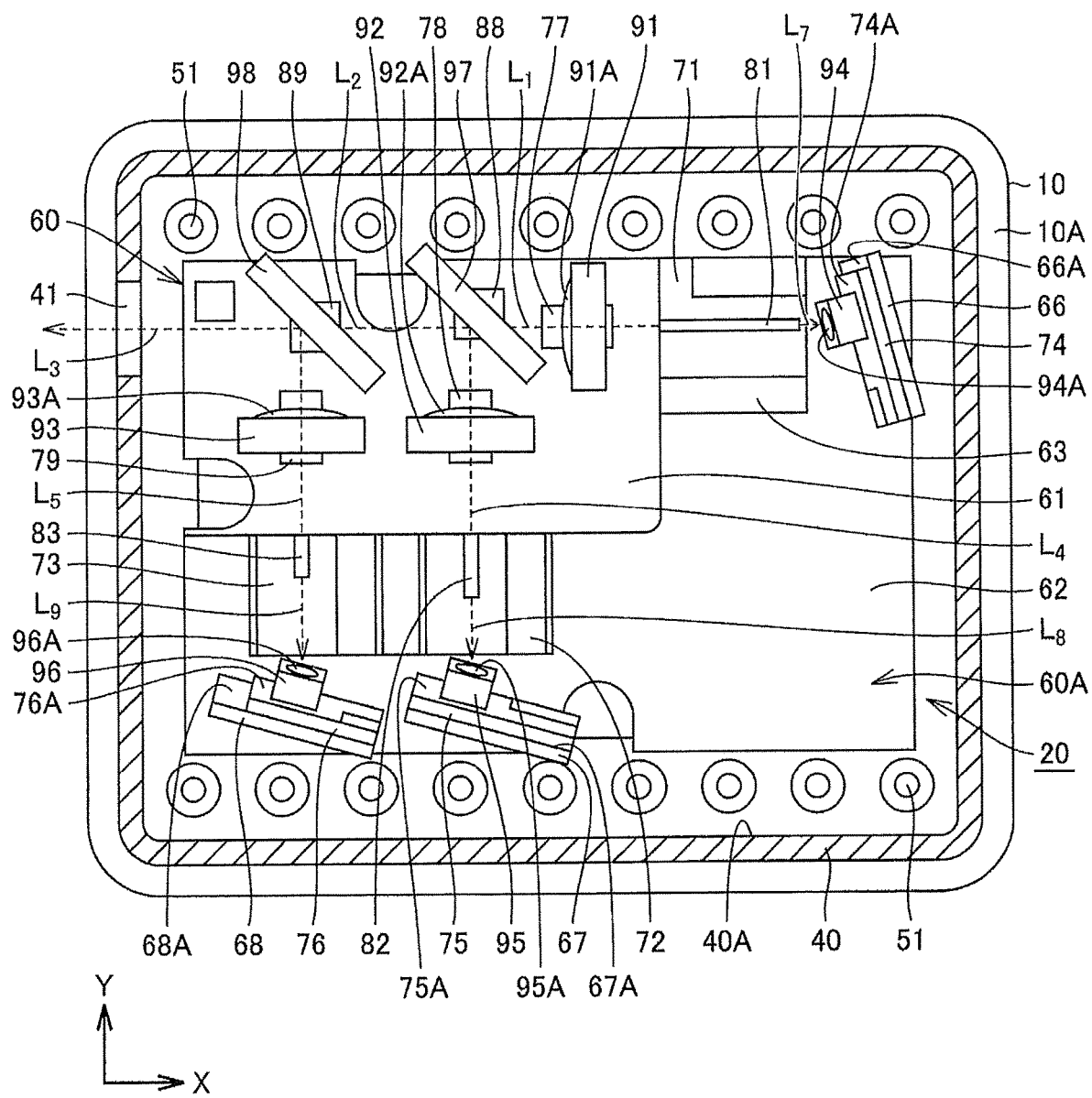
FIG. 8 is a schematic plan view illustrating the structure of the optical module of the third embodiment.

In the following, a third embodiment of the optical module of the present disclosures will be described by referring to FIG. 7 and FIG. 8. Referring to FIG. 7 and FIG. 8 as well as FIG. 1 through FIG. 4, the optical module 1 of the third embodiment essentially has a similar structure and similar advantages to the first embodiment. However, the optical module 1 of the third embodiment differs from that of the first embodiment in the arrangement of the first photodiode 94, the second photodiode 95, and the third photodiode 96.

With reference to FIG. 7 and FIG. 8, the support surfaces 66A, 67A, and 68A of the fourth block 66, the fifth block 67, and the sixth block 68 in the optical module 1 of the third embodiment are inclined relative to the planes perpendicular to the optical axes of light emitted from the red laser diode 81, the green laser diode 82, and the blue laser diode 83, respectively, through a rotation by an angle of greater than 0 degrees and less than 90 degrees in the direction of rotation within the X-Y plane. More preferably, the support surfaces 66A, 67A, and 68A of the fourth block 66, the fifth block 67, and the sixth block 68 are inclined relative to the planes perpendicular to the optical axes of light emitted from the red laser diode 81, the green laser diode 82, and the blue laser diode 83, respectively, through a rotation by an angle of greater than 0 degrees and less than 90 degrees in the direction of rotation within the X-Y plane. As a result, the first light receiving face 94A of the first photodiode 94 is inclined relative to a plane perpendicular to the optical axis of light emitted from the red laser diode 81 through a rotation by an angle of greater than 0 degrees and less than 90 degrees, or more preferably an angle of greater than 10 degrees and less than 30 degrees, in the direction of rotation within the X-Z plane (i.e., first plane), together with a rotation by an angle of greater than 0 degrees and less than 90 degrees, or more preferably an angle of greater than 10 degrees and less than 30 degrees, in the direction of rotation within the X-Y plane (i.e., second plane). As a result, the second light receiving face 95A of the second photodiode 95 and the third light receiving face 96A of the third photodiode 96 are inclined relative to planes perpendicular to the optical axes of light emitted from the green laser diode 82 and the blue laser diode 83, respectively, through a rotation by an angle of greater than 0 degrees and less than 90 degrees, or more preferably an angle of greater than 10 degrees and less than 30 degrees, in the direction of rotation within the Y-Z plane (i.e., first plane), together with a rotation by an angle of greater than 0 degrees and less than 90 degrees, or more preferably an angle of greater than 10 degrees and less than 30 degrees, in the direction of rotation within the X-Y plane (i.e., second plane).

Accordingly, the optical axes of backward light reflected at the first light receiving face 94A, the second light receiving face 95A, and the third light receiving face 96A are inclined relative to the optical axes of the forward red light, the forward green light, and the forward blue light, respectively. With this arrangement, the backward light reflected at the first light receiving face 94A, the second light receiving face 95A, and the third light receiving face 96A is much more unlikely to enter the first lens 91, the second lens 92, and the third lens 93, respectively, through the (substantially) same light paths as the forward light. The optical module 1 is thus an optical module for which stray light is unlikely to occur.

Fourth Embodiment

Figure 9:
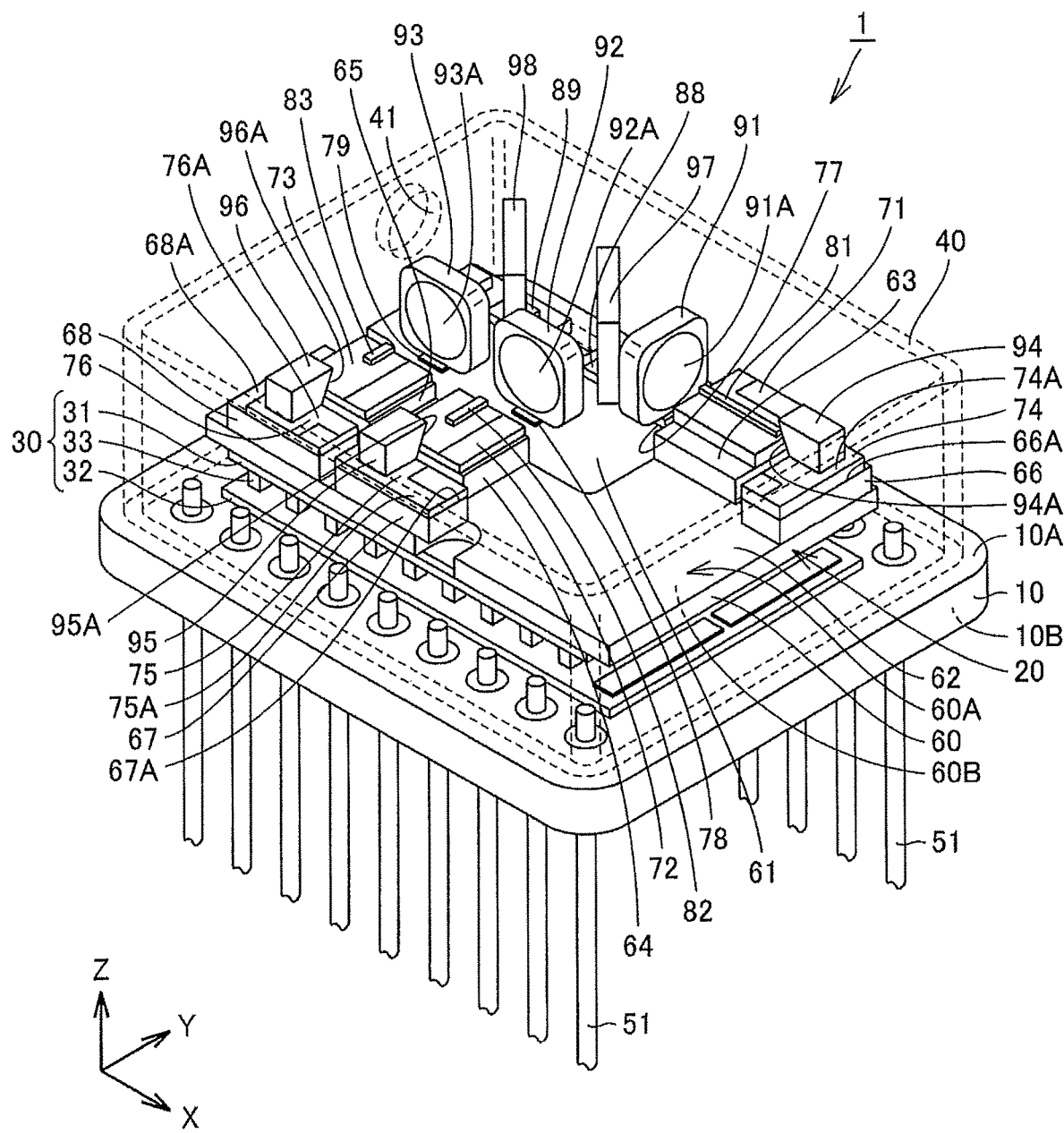
FIG. 9 is a schematic axonometric view illustrating the structure of an optical module of a fourth embodiment.
Figure 10:
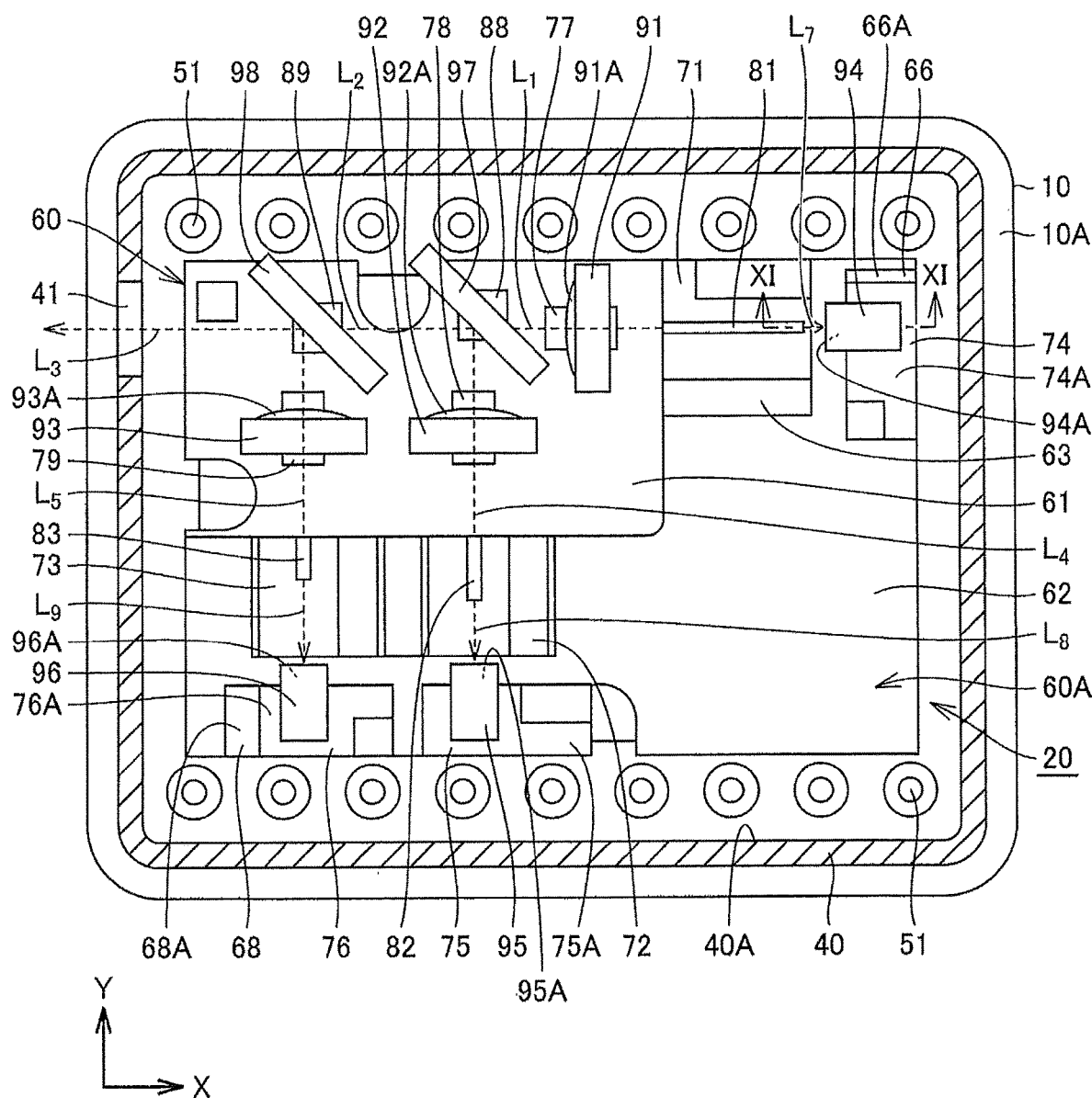
FIG. 10 is a schematic plan view illustrating the structure of the optical module of the fourth embodiment.
Figure 11:
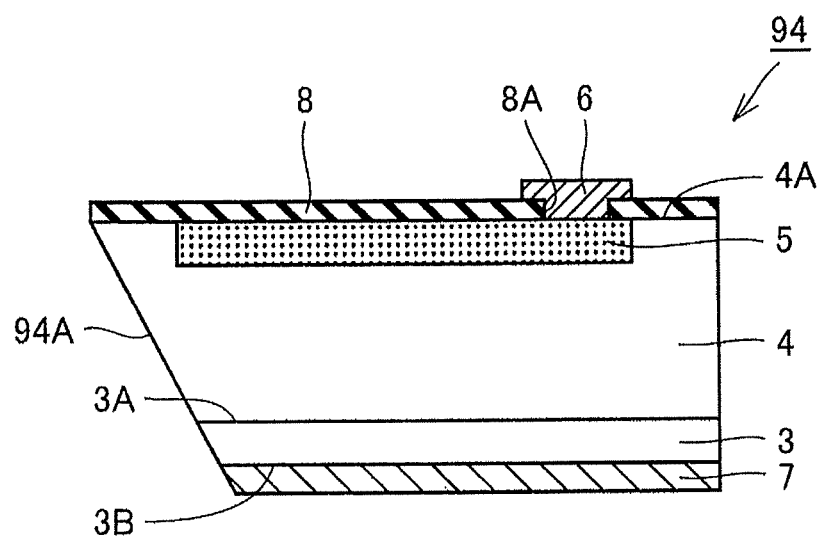
FIG. 11 is a schematic cross-sectional view illustrating the structure of a light receiving device of the fourth embodiment.

In the following, a fourth embodiment of the optical module of the present disclosures will be described by referring to FIG. 9 through FIG. 11. Referring to FIG. 9 through FIG. 11 as well as FIG. 1 through FIG. 4, the optical module 1 of the fourth embodiment essentially has a similar structure and similar advantages to the first embodiment. However, the optical module 1 of the fourth embodiment differs from that of the first embodiment in the arrangement and structure of the first photodiode 94, the second photodiode 95, and the third photodiode 96.

Referring to FIG. 9 and FIG. 10, the optical module 1 of the fourth embodiment have the fourth block 66, the fifth block 67, and the sixth block 68 that are rectangular parallelepiped. The support surfaces 66A, 67A, and 68A, which are the faces of the fourth block 66, the fifth block 67, and the sixth block 68 for holding the fourth submount 74, the fifth submount 75, and the sixth submount 76, respectively, are arranged to be parallel to the optical axes of light emitted from the red laser diode 81, the green laser diode 82, and the blue laser diode 83, respectively. More specifically, the support surfaces 66A, 67A, and 68A of the fourth block 66, the fifth block 67, and the sixth block 68 are parallel to the X-Y plane.

The fourth submount 74, the fifth submount 75, and the sixth submount 76 each having a flat plate shape are disposed on the support surfaces 66A, 67A, and 68A of the fourth block 66, the fifth block 67, and the sixth block 68, respectively. The first photodiode 94, the second photodiode 95, and the third photodiode 96 are disposed on the mounting surfaces 74A, 75A, and 76A, which are the main surfaces of the fourth submount 74, the fifth submount 75, and the sixth submount 76 situated opposite to the fourth block 66, the fifth block 67, and the sixth block 68, respectively.

In the following, the first photodiode 94 will be described as an example of the structure of a light receiving device used in the present embodiment, with reference to FIG. 11. The second photodiode 95 and the third photodiode 96 have the same or similar structure as the first photodiode 94. FIG. 11 is a cross-sectional view taken along the line XI-XI illustrated in FIG. 10.

Referring to FIG. 11, the first photodiode 94 of the fourth embodiment includes a high-concentration n-type layer 3, an n-type layer 4, a p-type region 5, an insulating film 8, a p-side electrode 6, and an n-side electrode 7.

The high-concentration n-type layer 3 contains an n-type impurity to have an n-type conductivity type. The n-type layer 4 is disposed on and in contact with a first main surface 3A of the high-concentration n-type layer. The n-type layer 4 contains an n-type impurity at a lower concentration than the high-concentration n-type layer 3 to have an n-type conductivity type. The p-type region 5 is formed within the n-type layer 4 to include the first main surface 4A of the n-type layer 4. The p-type region 5 contains a p-type impurity to have a p-type conductivity type. The high-concentration n-type layer 3, the n-type layer 4, and the p-type region 5 constitute a semiconductor layer.

The n-side electrode 7 is disposed on and in contact with a second main surface 3B of the high-concentration n-type layer 3. The n-side electrode 7 is made of a conductor such as metal. The n-side electrode 7 is in ohmic contact with the high-concentration n-type layer 3. The insulating film 8 is disposed on and in contact with the main surface of the semiconductor layer situated opposite to the n-side electrode 7. The insulating film 8 is made of an insulating material. The insulating film 8 has a through-hole 8A extending through the insulating film 8 in the thickness direction. The through-hole 8A is formed in the area corresponding to the p-type region 5. Namely, the p-type region 5 is exposed through the through-hole 8A. The p-side electrode 6 is disposed such as to be in contact with the p-type region 5 exposed through the through-hole 8A. The p-side electrode 6 is made of a conductor such as metal. The p-side electrode 6 is in ohmic contact with the p-type region 5.

A light receiving face 94A for receiving light incident to the semiconductor layer is formed on the end face of the semiconductor layer. The light receiving face 94A is inclined relative to a plane parallel to the main surfaces of the semiconductor layer. More specifically, the light receiving face 94A is at an angle of greater than 0 degrees and less than 90 degrees relative to a plane parallel to the main surfaces of the semiconductor layer. For example, the light receiving face 94A is at an angle of greater than 40 degrees and less than 70 degrees relative to a plane parallel to the main surfaces of the semiconductor layer. More preferably, the light receiving face 94A is at an angle of greater than 50 degrees and less than 60 degrees relative to a plane parallel to the main surfaces of the semiconductor layer. The cross-sectional area perpendicular to the direction in which the layers of the semiconductor layer are stacked one over another decreases toward the n-side electrode 7 away from the insulating film 8.

Light entering the light receiving face 94A causes carriers to be generated in numbers corresponding to the intensity of light incident in the p-type region 5 and the n-type layer 4. Detecting this as a current through the p-side electrode 6 and the n-side electrode 7 allows information about the intensity of incident light to be obtained.

Referring to FIG. 9 through FIG. 11, the first photodiode 94 is disposed on the fourth submount 74 such that the main surface of the n-side electrode 7 situated opposite to the high-concentration n-type layer 3 faces the mounting surface 74A. The second photodiode 95 is disposed on the fifth submount 75 such that the main surface of the n-side electrode 7 situated opposite to the high-concentration n-type layer 3 faces the mounting surface 75A. The third photodiode 96 is disposed on the sixth submount 76 such that the main surface of the n-side electrode 7 situated opposite to the high-concentration n-type layer 3 faces the mounting surface 76A. As a result, the first light receiving face 94A, the second light receiving face 95A, and the third light receiving face 96A are inclined with respect to a plane perpendicular to the optical axis of the backward red light, a plane perpendicular to the optical axis of the backward green light, and a plane perpendicular to the optical axis of the backward blue light, respectively.

Accordingly, the optical axes of backward light reflected at the first light receiving face 94A, the second light receiving face 95A, and the third light receiving face 96A are inclined relative to the optical axes of the forward red light, the forward green light, and the forward blue light, respectively. With this arrangement, the backward light reflected at the first light receiving face 94A, the second light receiving face 95A, and the third light receiving face 96A is more unlikely to enter the first lens 91, the second lens 92, and the third lens 93, respectively, through the (substantially) same light paths as the forward light. The optical module 1 is thus an optical module for which stray light is unlikely to occur.

While the above-described embodiments are directed to examples in which wavelength selective filters are employed as the first filter 97 and the second filter 98, these filters may alternatively be polarization synthesizing filters.

All the embodiments disclosed herein are examples only, and should be interpreted as non-limiting in any aspects. The scope of the present invention is not defined by the descriptions provided heretofore, but is defined by the claims. Any modifications representing and within the equivalent scope of the claims are intended within the scope of the present invention.

INDUSTRIAL APPLICABILITY

The optical module of the present disclosures may be employed particularly effectively as an optical module for which stray light reduction is required.

DESCRIPTION OF REFERENCE SYMBOLS

1 optical module
3 high-density n-type layer
3A first main surface
3B second main surface
4 n-type layer
4A main surface
5 p-type region
6 p-side electrode
7 n-side electrode
8 insulating film
8A through-hole
10 base
10A, 10B main surface
20 light forming unit
30 electronic cooling module
31 heatsink plate
32 heatsink plate
33 semiconductor pillar
40 cap
41 exit window
51 lead pin
60 base plate
60A, 60B main surface
63 first block
64 second block
65 third block
66 fourth block
67 fifth block
68 sixth block
66A, 67A, 68A support surface
71 first submount
72 second submount
73 third submount
74 fourth submount
75 fifth submount
76 sixth submount
74A, 75A, 76A mounting surface
77 first lens support
78 second lens support
79 third lens support
81 red laser diode
82 green laser diode
83 blue laser diode
88 first protrusion
89 second protrusion
91 first lens
92 second lens
93 third lens
91A, 92A, 93A lens section
94 first photodiode
95 second photodiode
96 third photodiode
94A first light receiving face
95A second light receiving face
96A third light receiving face
97 first filter
98 second filter

The invention claimed is:

1. An optical module, comprising:
a light forming unit configured to form light; and
a protective member disposed to cover the light forming unit,
wherein the light forming unit includes:
a base member;
a red semiconductor laser disposed on the base member to emit red light;
a green semiconductor laser disposed on the base member to emit green light;
a blue semiconductor laser disposed on the base member to emit blue light;
a first lens disposed on the base member to change a spot size of light emitted from the red semiconductor laser;
a second lens disposed on the base member to change a spot size of light emitted from the green semiconductor laser;
a third lens disposed on the base member to change a spot size of light emitted from the blue semiconductor laser;
a first light receiving device disposed on the base member and having a first light receiving face that receives backward red light emitted from the red semiconductor laser in an opposite direction to light emitted therefrom toward the first lens;
a second light receiving device disposed on the base member and having a second light receiving face that receives backward green light emitted from the green semiconductor laser in an opposite direction to light emitted therefrom toward the second lens; and a third light receiving device disposed on the base member and having a third light receiving face that receives backward blue light emitted from the blue semiconductor laser in an opposite direction to light emitted therefrom toward the third lens, wherein the first light receiving face, the second light receiving face, and the third light receiving face are inclined relative to a plane perpendicular to an optical axis of the backward red light, a plane perpendicular to an optical axis of the backward green light, and a plane perpendicular to an optical axis of the backward blue light, respectively.

2. The optical module as claimed in claim 1, wherein the first light receiving face, the second light receiving face, and the third light receiving face are inclined relative to a plane perpendicular to an optical axis of the backward red light, a plane perpendicular to an optical axis of the backward green light, and a plane perpendicular to an optical axis of the backward blue light, respectively, through a rotation in a direction within a first plane inclusive of an optical axis of received light and perpendicular to a main surface of the base member together with a rotation in a direction within a second plane parallel to the main surface of the base member, relative to a plane perpendicular to an optical axis of the backward red light, a plane perpendicular to an optical axis of the backward green light, and a plane perpendicular to an optical axis of the backward blue light, respectively.

3. The optical module as claimed in claim 1, wherein at least one light receiving device among the first light receiving device, the second light receiving device, and the third light receiving device is mounted on a mounting surface of a support disposed on the base member, and wherein the mounting surface is inclined relative to a plane perpendicular to an optical axis of light received by the at least one light receiving device.

4. The optical module as claimed in claim 1, wherein at least one light receiving device among the first light receiving device, the second light receiving device, and the third light receiving device is a light receiving semiconductor device including a semiconductor layer, and wherein the light receiving semiconductor device has a light receiving face inclined relative to a plane parallel to a main surface of the semiconductor layer.

5. The optical module as claimed in claim 2, wherein at least one light receiving device among the first light receiving device, the second light receiving device, and the third light receiving device is mounted on a mounting surface of a support disposed on the base member, and wherein the mounting surface is inclined relative to a plane perpendicular to an optical axis of light received by the at least one light receiving device.

6. The optical module as claimed in claim 2, wherein at least one light receiving device among the first light receiving device, the second light receiving device, and the third light receiving device is a light receiving semiconductor device including a semiconductor layer, and wherein the light receiving semiconductor device has a light receiving face inclined relative to a plane parallel to a main surface of the semiconductor layer.

7. The optical module as claimed in claim 3, wherein at least one light receiving device among the first light receiving device, the second light receiving device, and the third light receiving device is a light receiving semiconductor device including a semiconductor layer, and wherein the light receiving semiconductor device has a light receiving face inclined relative to a plane parallel to a main surface of the semiconductor layer.

8. The optical module as claimed in claim 5, wherein at least one light receiving device among the first light receiving device, the second light receiving device, and the third light receiving device is a light receiving semiconductor device including a semiconductor layer, and wherein the light receiving semiconductor device has a light receiving face inclined relative to a plane parallel to a main surface of the semiconductor layer.

9. An optical module, comprising:

a base member having a flat main surface;

a semiconductor laser disposed on the flat main surface of the base member;

an optical system disposed on the base member to receive light from the semiconductor laser;

a block standing on the flat main surface of the base member, the block having an inclined lateral face that serves as a support surface; and a light receiving device disposed on the support surface of the block and having a light receiving face that receives backward light emitted from the semiconductor laser in an opposite direction to light emitted from the semiconductor laser toward the optical system, wherein the support surface and the light receiving face are inclined relative to a plane perpendicular to an optical axis of the backward light.

* * * * *